US012768894B2

(12) United States Patent

Kim et al.

(10) Patent No.: US 12,768,894 B2

(45) Date of Patent: Oct. 20, 2026

(54) EVALUATION SYSTEM FOR DRY ELECTRODE MIXTURE OF VEHICLE BATTERY

(71) Applicants: Hyundai Motor Company, Seoul (KR); Kia Corporation, Seoul (KR)

(72) Inventors: Hyun Jin Kim, Daegu (KR); Chan Bum Park, Suwon (KR); Geun Ho Choi, Suwon (KR); Han Nah Song, Suwon (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 225 days.

(21) Appl. No.: 18/389,505

(22) Filed: Nov. 14, 2023

(65) Prior Publication Data

US 2024/0361393 A1 Oct. 31, 2024

(30) Foreign Application Priority Data

Apr. 28, 2023 (KR) ........................ 10-2023-0055862

(51) Int. Cl.

| | |
|---|---|
| ***G01R 31/385*** | (2019.01) |
| ***G01R 31/36*** | (2020.01) |
| ***G06N 3/08*** | (2023.01) |
| ***H01M 4/04*** | (2006.01) |
| ***H01M 10/42*** | (2006.01) |

(52) U.S. Cl.

CPC ..... *G01R 31/3865* (2019.01); *G01R 31/3644* (2013.01); *G06N 3/08* (2013.01); *H01M 4/04* (2013.01); *H01M 10/4285* (2013.01); *H01M 2220/20* (2013.01)

(58) Field of Classification Search

CPC .. G01R 31/3865; G01R 31/3644; G06N 3/08; H01M 4/04; H01M 10/4285; H01M 2220/20

USPC ...................... 324/500, 600, 76.11, 415–437

See application file for complete search history.

(56) References Cited

U.S. PATENT DOCUMENTS

| | | | | |
|---|---|---|---|---|
| 9,368,796 | B2 * | 6/2016 | Wakizaka | H01M 10/0525 |
| 2013/0323590 | A1 * | 12/2013 | Kageura | H01M 4/485 429/211 |
| 2014/0335410 | A1 * | 11/2014 | Loveridge | H01M 4/622 252/511 |
| 2017/0098818 | A1 * | 4/2017 | Cheng | H01M 4/662 |
| 2019/0036154 | A1 * | 1/2019 | Kim | H01M 4/525 |
| 2019/0198879 | A1 * | 6/2019 | Nagai | B82B 1/00 |
| 2021/0305556 | A1 * | 9/2021 | Otaki | H01M 4/366 |
| 2022/0367872 | A1 * | 11/2022 | Lv | H01M 10/052 |
| 2024/0047773 | A1 * | 2/2024 | Cummings | H01M 10/486 |

(Continued)

FOREIGN PATENT DOCUMENTS

| | | | |
|---|---|---|---|
| NO | 2019/191397 | A1 | 10/2019 |
| WO | 2019/222110 | A1 | 11/2019 |

*Primary Examiner* — Huy Q Phan

*Assistant Examiner* — Trung Q Nguyen

(74) *Attorney, Agent, or Firm* — Fox Rothschild LLP

(57) ABSTRACT

A vehicle such as an electric vehicle may include a battery such as a secondary battery that includes an electrode manufactured using a dry process. A system for evaluating a dry electrode mixture of the battery includes an electrical conductivity measurement device configured to measure electrical conductivity of the dry electrode mixture, and an analysis device configured to evaluate the dry electrode mixture based on the measured electrical conductivity.

18 Claims, 15 Drawing Sheets

(56) References Cited

U.S. PATENT DOCUMENTS

2024/0322112 A1* 9/2024 Nam ..................... H01M 4/131
2024/0372139 A1* 11/2024 Molinski ........... H01M 10/0525

* cited by examiner

EVALUATION SYSTEM FOR DRY ELECTRODE MIXTURE OF VEHICLE BATTERY

CROSS-REFERENCE TO RELATED APPLICATION

This application claims under 35 U.S.C. § 119(a) the benefit of Korean Patent Application No. 10-2023-0055862, filed on Apr. 28, 2023, the entire contents of which are incorporated herein by reference.

BACKGROUND

(a) Technical Field

The present disclosure relates to manufacture of a battery for a vehicle, more particularly, to an evaluation system for manufacturing a dry electrode for the battery of the vehicle such as an electric vehicle.

(b) Description of the Related Art

Recently, a rechargeable secondary battery is expanding its application in various fields from a small electronic device to a large energy storage system. Particularly, with the rapid growth of the electric vehicle market, research and development on the secondary battery is being actively conducted.

The electrode of the secondary battery has been generally manufactured through a wet process. In the wet process, an electrode material, a binder, and a conductive additive contained in the electrode are dissolved in a solvent to prepare a slurry. Alternatively, a dry process is performed without using a solvent, which is needed in the wet process, and the dry process is capable of increasing an energy density of a battery compared to the wet process.

In the dry process of manufacturing an electrode, an electrode active material, a conductive additive, and a binder are mixed without a solvent to form a mixture, and then the mixture is formed into a dry electrode film using a press or calendaring method. Then the dry electrode film is attached to a current collector, thereby completing manufacturing of the electrode.

Because the manufacturing of the electrode using the dry process is in early stages of technological development, there is no standard technique to evaluate the quality of the electrode. For this reason, if a defect is found in a final stage of the manufacturing process, it is typically necessary to return to the first stage to solve the defect, thus increasing material costs and time in the manufacturing process.

The above information disclosed in this Background section is only for enhancement of understanding of the background of the disclosure, and therefore it may contain information that does not form the prior art that is already known to a person of ordinary skill in the art.

SUMMARY

The present disclosure provides an evaluation system for analyzing a dry electrode mixture, which is capable of measuring and/or analyzing characteristics of the dry electrode mixture during manufacture of the dry electrode.

In one aspect, a system for evaluating a dry electrode mixture according to the present disclosure includes an electrical conductivity measurement device configured to measure an electrical conductivity of the dry electrode mixture and an analysis device configured to evaluate the dry electrode mixture based on the measured electrical conductivity measurement.

A battery for a vehicle (e.g., an electric vehicle) may be produced from the above-described system. The battery may be a secondary battery for the electric vehicle.

A vehicle may include the battery as described above.

Other aspects and preferred embodiments of the disclosure are discussed infra.

BRIEF DESCRIPTION OF THE DRAWINGS

The above and other features of the present disclosure will now be described in detail with reference to certain embodiments thereof illustrated in the accompanying drawings which are given hereinbelow by way of illustration only, and thus are not limitative of the present disclosure, and wherein.

Figure 1:
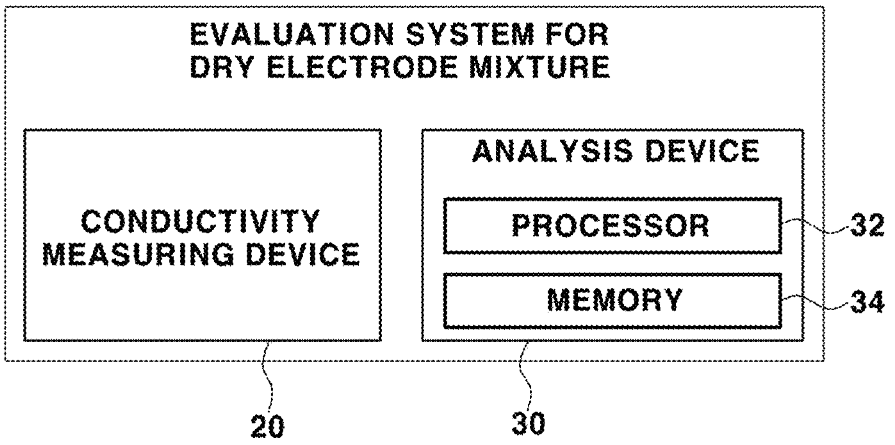
FIG. 1 is a configuration diagram of an evaluation system for analyzing a dry electrode mixture according to the present disclosure.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes, will be determined in part by the particular intended application and usage environment.

In the figures, the reference numbers refer to the same or equivalent parts of the present disclosure throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Descriptions of specific structures or functions presented in the embodiments of the present disclosure are merely exemplary for the purpose of explaining the embodiments according to the concept of the present disclosure, and the embodiments according to the concept of the present disclosure may be implemented in various forms. In addition, the descriptions should not be construed as being limited to the embodiments described herein, and should be understood to include all modifications, equivalents and substitutes falling within the idea and scope of the present disclosure.

Meanwhile, in the present disclosure, terms such as "first" and/or "second" may be used to describe various components, but the components are not limited by the terms. These terms are only used to distinguish one component from another. For example, a first component could be termed a second component, and similarly, a second component could be termed a first component, without departing from the scope of exemplary embodiments of the present disclosure.

It will be understood that, when a component is referred to as being "connected to" another component, the component may be directly connected to the other component, or intervening components may also be present. In contrast, when a component is referred to as being "directly connected to" another component, there is no intervening component present. Other terms used to describe relationships between components should be interpreted in a like fashion (e.g., "between" versus "directly between," "adjacent" versus "directly adjacent," etc.).

Throughout the specification, like reference numerals indicate like components. The terminology used herein is for the purpose of illustrating embodiments and is not intended to limit the present disclosure. In this specification, the singular form includes the plural sense, unless specified otherwise. The terms "comprises" and/or "comprising" used in this specification mean that the cited component, step, operation, and/or element does not exclude the presence or addition of one or more of other components, steps, operations, and/or elements.

Hereinafter, the present disclosure will be described in detail with reference to the accompanying drawings.

A dry electrode for a battery (e.g., a secondary battery of an electric vehicle) may be made from a dry electrode mixture and a current collector. The dry electrode may be manufactured in such a manner that the dry electrode mixture is introduced into a manufacturing apparatus 10, which is a film-forming facility, to be formed into a dry electrode film through a film forming process, and then the dry electrode film is attached or laminated to the current collector.

The dry electrode mixture comprises an electrode active material, a conductive additive, and a binder. The dry electrode mixture is prepared by mixing the electrode active material, the conductive additive, and the binder in a mixer. As a non-limiting example, the dry electrode mixture may be prepared in a high shear mixer using rotation or a fluid mixer using air. A dispersion condition may vary depending on a dispersing speed (rotational speed) of the mixer and dispersing time (operating time) of the mixer.

According to the present disclosure, the dry electrode may be a cathode or an anode.

In some implementations, in the cathode, the electrode active material comprises a cathode active material. As a non-limiting example, the cathode active material may be nickel manganese cobalt (NMC) series, lithium ferrophosphate (LFP), lithium cobalt (LCO), or sulfur. In some implementations, in the anode, the electrode active material comprises an anode active material. As a non-limiting example, the anode active material is graphite series and may comprise silicon.

The conductive additive may comprise a carbon-based material. In addition, for a dry electrode of an all-solid-state battery, the dry electrode mixture may further comprise a polyethylene oxide (PEO)-based polymer and an oxide-based and sulfide-based solid electrolyte. The binder may comprise polytetrafluoroethylene (PTFE), polyvinylidene fluoride (PVDF), or styrene butadiene rubber (SBR).

In forming a film of the dry electrode, the dispersion degree of the dry electrode mixture is crucial. A free-standing dry electrode film may be obtained only when the electrode material is properly dispersed, and the binder is fiberized to a predetermined degree. Even in a free-standing dry electrode film, when the dispersion degree is locally different, the cell performance of the battery may be deteriorated. Therefore, in order to obtain a dry electrode film that satisfies the quality standards, the proportion and dispersion degree of each constituent of the dry electrode mixture, and the fibrous degree of the binder need to be evaluated.

For this reason, the present disclosure provides a system for evaluating a dry electrode mixture which includes an electrical conductivity measurement device configured to measure an electrical conductivity of the dry electrode mixture and an analysis device capable of analyzing the measured results.

As described above, the dry electrode mixture comprise an electrode active material, a conductive additive, and a binder. Each constituent has a different inherent characteristic of electrical conductivity. Further, because the size of agglomerated binder, the dispersion degree of binder, and the like vary depending on the fibrous degree of the binder, the electrical conductivity characteristic may vary depending on the shape or density of the binder. The present disclosure is configured to evaluate the dry electrode mixture using such characteristics of the dry electrode mixture.

Fiberization of binder may be described as a change of round binder particles into thread-like binder particles while energy is applied to the dry electrode mixture in the process of mixing the dry electrode mixture. Specifically, the binder includes primary particles and secondary particles. Small binder particles of about 500 nanometers or less may be regarded as primary particles, and particles in which these primary particles are agglomerated to a size of approximately several hundred micrometers may be regarded as secondary particles. As energy is applied during the mixing process of the dry electrode mixture, the agglomerated secondary particles are separated into primary particles, and the primary particles change from a round shape to a thin thread or skein shape by high shear, which is called fiberization of binder.

In the fiberization process of the binder, the length of the thin thread may be long or short, thick or thin. Such degrees may be regarded as the fibrous degree of the binder. As described above, the fiberization of binder should be made to an appropriate level.

The fibrous degree of the binder may depend on the dispersion condition, such as the dispersing speed or dispersion time of a particular dry electrode mixture. For example, as the dispersing speed or the dispersion time increases in the same dry electrode mixture, the fibrous degree of the binder generally increases. Further, as the fiberization of the binder progresses, the electrical conductivity increases, converges to a predetermined level, and then decreases again. As the fiberization of the binder progresses, the thick thread-like tissue spreads thinly and an electron movement path may be secured, reducing the interparticle resistance and increasing the conductivity of the dry electrode mixture. However, when the fiberization of the binder progresses excessively, the thread-like tissue is coated on the electrode particles, increasing the resistance and decreasing the conductivity. Moreover, in order to attach a fiberized dry electrode mixture to a substrate, the fiberized dry electrode needs to be formed into a thin film. It is advantageous in forming such a thin film when the dry electrode mixture has a thread structure having a predetermined thickness or greater. In other words, excessive fiberization is disadvantageous in forming a film. The dispersing speed and dispersing time for appropriate fiberization may be defined for each dry electrode mixture, considering such characteristics.

As in FIG. 1, according to the present disclosure, an evaluation system for a dry electrode mixture M includes an electrical conductivity measurement device 20 and an analysis device 30. The electrical conductivity measurement device 20 is configured to measure an electrical conductivity of the dry electrode mixture M. The analysis device 30 is configured to analyze the measured electrical measurement.

Figure 2:
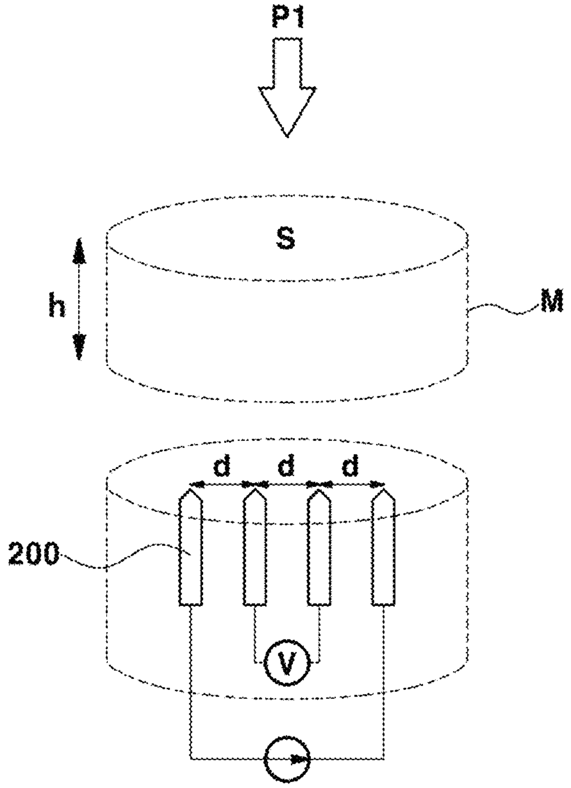
FIG. 2 illustrates an electrical conductivity measurement device of an evaluation system for analyzing a dry electrode mixture according to an embodiment of the present disclosure.

The electrical conductivity measurement device 20 is configured to measure an electrical conductivity of the dry electrode mixture M while applying a preset or variable pressure to the dry electrode mixture M. As illustrated in FIG. 2, the dry electrode mixture M is fixed in volume or mass w, having an area S and a height h. The electrical conductivity of the dry electrode mixture M, set to the predetermined volume, is measured at a lower side of the dry electrode mixture M using a probe 200 while applying a constant pressure P1 to the dry electrode mixture M from the top. Thereafter, the electrical conductivity (Siemens per centimeter) depending on the pressure (pascal) is measured, and the measured data is transmitted to the analysis device 30 to be used for evaluation of the dry electrode mixture M.

Specifically, FIGS. 3 to 8 illustrate the electrical conductivity measurement device 20 according to an implementation of the present disclosure. The electrical conductivity measurement device 20 includes a base rod 210, a measurement space 220, a feeder 230, a pressure applicator 240, and a controller 250.

Figure 9A:
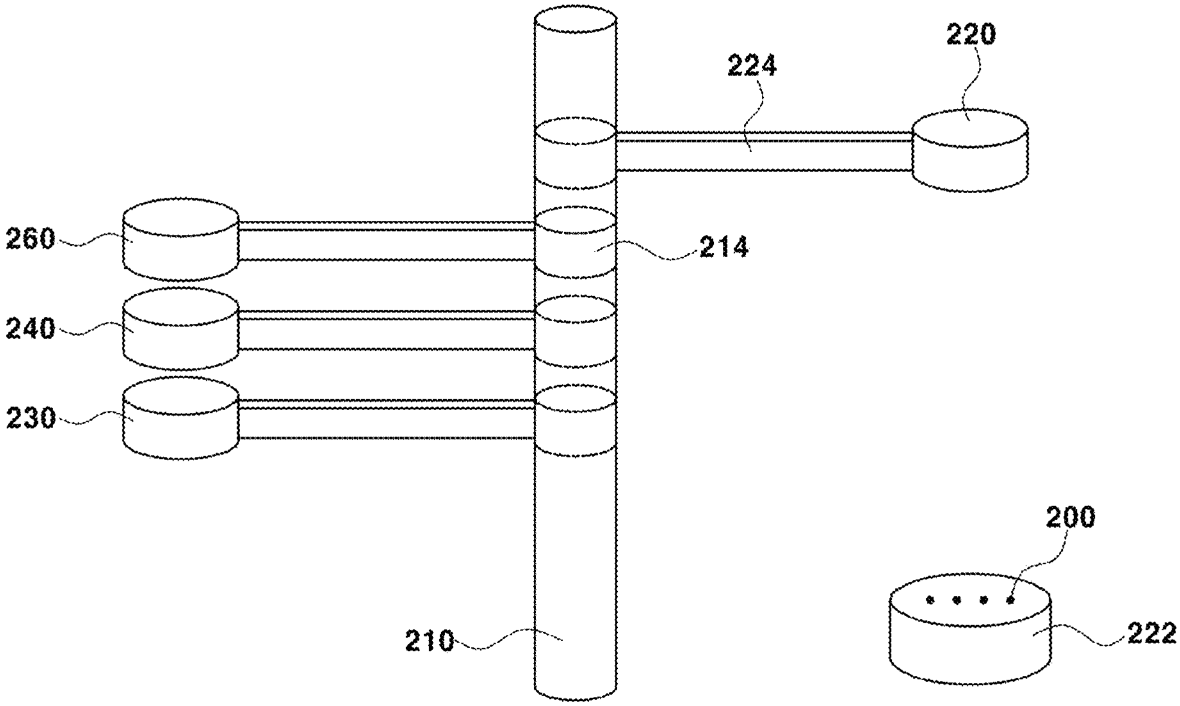
FIG. 9A illustrates a base rod of an electrical conductivity measurement device according to an embodiment of the present disclosure.
Figure 9B:
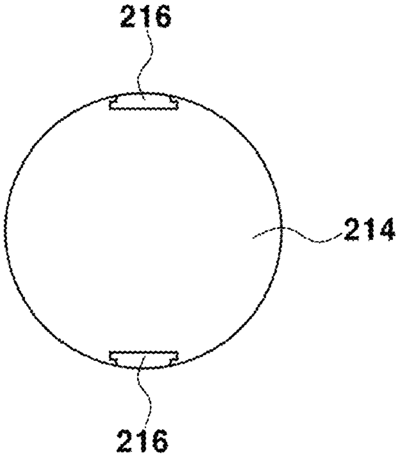
FIGS. 9B to 9D illustrate a state in which each component of an electrical conductivity measurement device is mounted to a base rod through a rotating body.
Figure 9C:
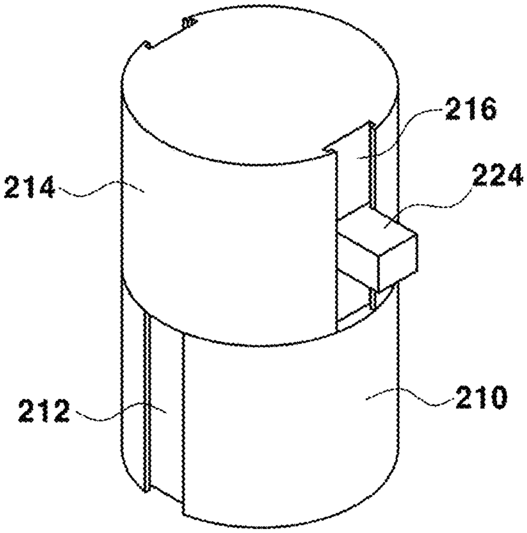
Figure 9D:
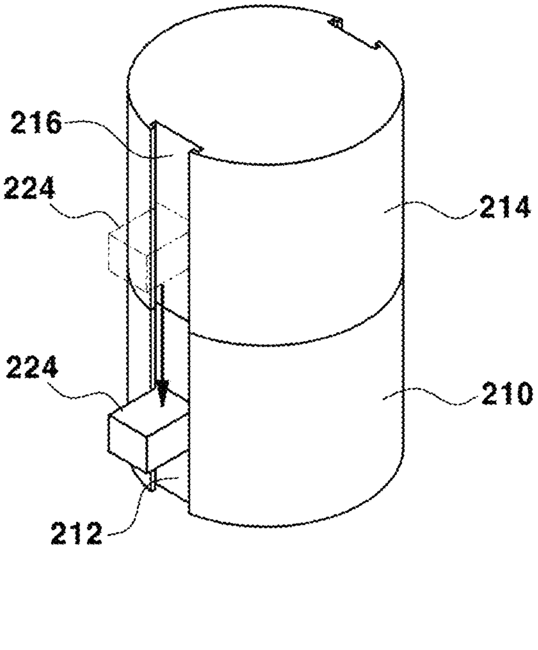

The base rod 210 is fixed. To the base rod 210, components of the electrical conductivity measurement device 20 are movably and/or rotatably mounted. In some implementations, as illustrated in FIG. 9A, components, such as the measurement space 220, the feeder 230, the pressure applicator 240, a remover 260, and a cleaner 270, may be rotatably and linearly movably mounted to the base rod 210 through the rotating body 214 rotatable about the base rod 210. Each of arms 224, 234, 242, 262, and 274 may move upward or downward through rails 216 in the rotating body 214 and may rotate together with the rotating body 214. As illustrated in FIG. 9B, the rails 216 are provided at opposite sides of the rotating body 214. The base rod 210 also has rails 212 at opposite sides thereof. Therefore, as illustrated in FIGS. 9C and 9D, each of the components may move upward and downward without interfering with each other on the base rod 210.

The measurement space 220 is mounted to the base rod 210. The measurement space 220 may move upward and downward along the base rod 210. Further, the measurement space 220 may rotate about the base rod 210.

The measurement space 220 includes the probe 200 configured to measure an electrical conductivity. In an implementation, the measurement space 220 may have a support 222 provided therein, and the probe 200 may be installed in the support 222. The support 222 may be provided at a predetermined height in the measurement space 220. The support 222 may be separated from the measurement space 220 when the measurement space 220 moves. As illustrated in FIG. 9A, the support 222 and the probe 200 may be fixed when the measurement space 220 moves.

The probe 200 may measure the electrical conductivity at multiple spots on the dry electrode mixture M. For example, the probe 200 may include at least four probes, and each of the probes 200 may measure the electrical conductivity of the dry electrode mixture M at its installed position.

The feeder 230 is mounted to the base rod 210. The feeder 230 may move along the base rod 210. Further, the feeder 230 may rotate around the base rod 210.

The feeder 230 may be supplied with the dry electrode mixture M manufactured in the manufacturing apparatus 10 for the dry electrode mixture M. Specifically, the dry electrode mixture M of a measurement target may be supplied to a receiving portion 232 in the feeder 230 through a supply hose 12 extending from the manufacturing apparatus 10.

Figure 4:
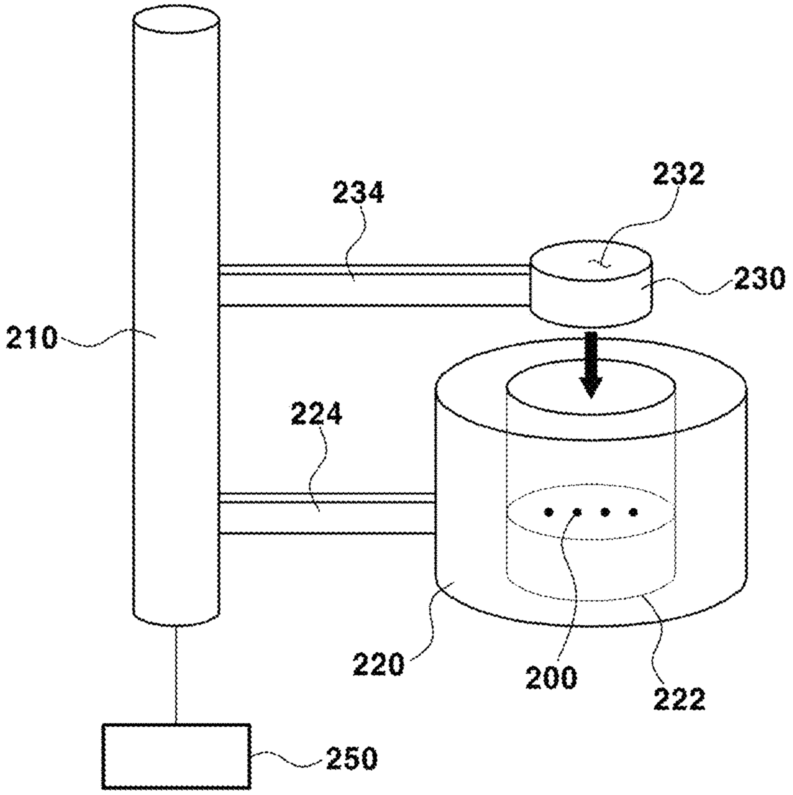

As illustrated in FIG. 4, the feeder 230 is configured to supply the dry electrode mixture M as the measurement target supplied through the supply hose 12 into the measurement space 220. For example, the feeder 230 includes the receiving portion 232 configured to receive therein the dry electrode mixture M having a predetermined volume or mass. Further, the feeder 230 may convey the dry electrode mixture M received in the receiving portion 232 to the support 222 in the measurement space 220. The conveyed dry electrode mixture M may come into contact with the probe 200. In some implementations, an openable hole may be formed at the bottom of the receiving portion 232. By opening and closing the hole, the dry electrode mixture M in the receiving portion 232 may be supplied to the support 222 in the measurement space 220. In some implementations, the feeder 230 may rotate. The feeder 230 may rotate with respect to the arm 234 of the feeder 230 to supply the dry electrode mixture M to the support 222.

Figure 5:
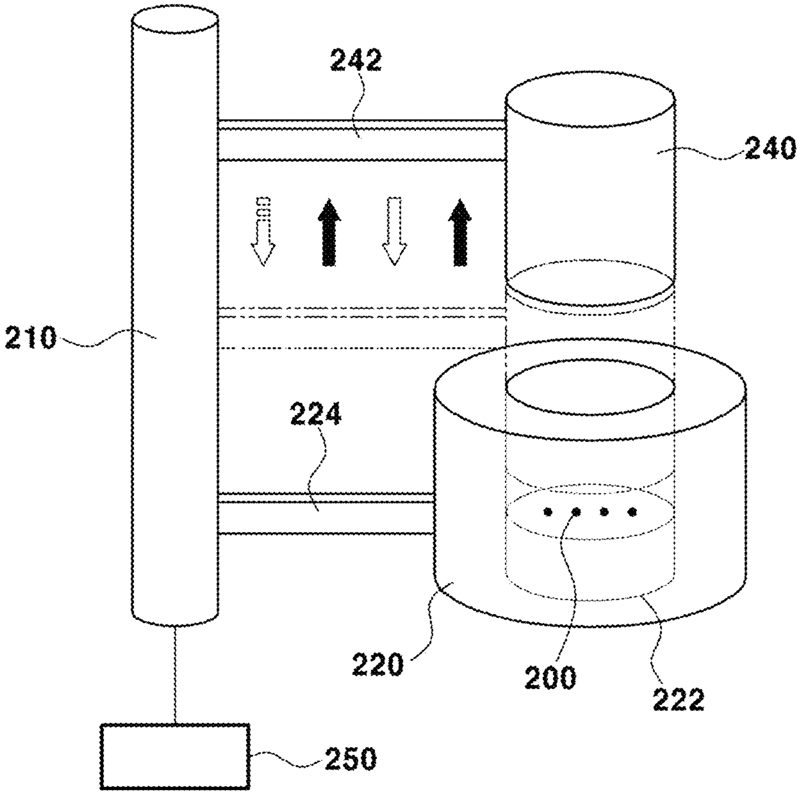

Referring to FIG. 5, the pressure applicator 240 is configured to provide a pressing force. Specifically, the pressure applicator 240 is configured to apply a pressure to the dry electrode mixture M placed in the measurement space 220. The pressure applicator 240 may increase the pressing force as the pressure applicator is moved downward.

The pressure applicator 240 may be mounted to the base rod 210. Specifically, the pressure applicator 240 may move along the base rod 210 and may rotate around the base rod 210. The pressure applicator 240 may adjust the pressure applied to the dry electrode mixture M while being moved along the base rod 210.

According to an implementation of the present disclosure, the electrical conductivity measurement device 20 may further include the remover 260. The remover 260 is configured to remove the dry electrode mixture M placed on the support 222. In an implementation, the remover 260 may remove the dry electrode mixture M from the support 222 using a suctioning method. In some implementations, the remover 260 may spray a predetermined amount of ethanol and the like while moving.

The remover 260 is mounted to the base rod 210. The remover 260 may also be movable along the base rod 210 and rotatable around the base rod 210.

According to an implementation of the present disclosure, the electrical conductivity measurement device 20 may further include the cleaner 270. The cleaner 270 may remove the dry electrode mixture M remaining in the measurement space 220.

The cleaner 270 is mounted to the base rod 210. The cleaner 270 may also be movable along the base rod 210, like the other components. Further, the cleaner 270 may rotate around the base rod 210. The cleaner 270 may include a cleaning element 272 and the cleaning arm 274. The cleaning element 272 may rotate with respect to the cleaning arm 274. The cleaning element 272 includes a brush and the likes and may remove the dry electrode mixture M remaining in the measurement space 220 while rotating and/or moving linearly.

The controller 250 is configured to control each of the components of the electrical conductivity measurement device 20. The controller 250 may control the rotation and the likes of the arms 224, 234, 242, 262, 274. and the rotating body 214. The controller 250 may control the movement and operation of each component of the measuring device 20 at a preset time point. Further, the controller 250 is configured to communicate with the analysis device 30 to transmit measurement results measured by the probe 200 to the analysis device 30.

Figure 10:
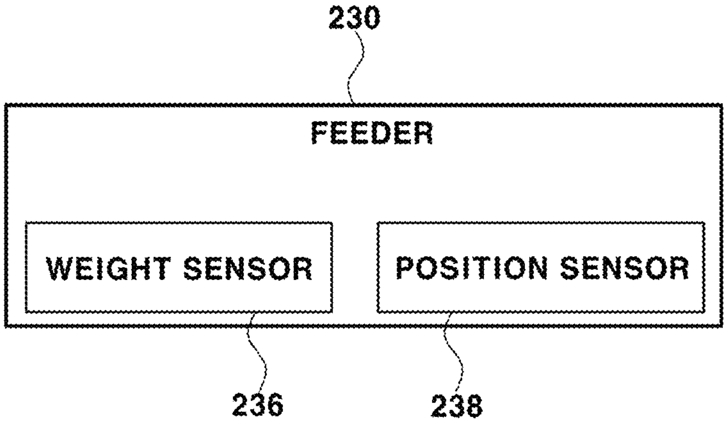
FIG. 10 is a configuration diagram of a feeder according to an embodiment of the present disclosure.

The mass or volume of the dry electrode mixture M to be received in the receiving portion 232 may be controlled. For example, referring to FIG. 10, the receiving portion 232 may have a weight sensor 236 mounted therein. The controller 250 is configured to communicate with the weight sensor 236. When the dry electrode mixture M supplied from the supply hose 12 reaches a predetermined mass, the controller 250 may stop the supply of the dry electrode mixture M from the supply hose 12. To this end, the supply hose 12 may be provided with a valve 14 controllable by the controller 250. In a different implementation of the present disclosure, the receiving portion 232 may have a position sensor 238 provided therein. When the position sensor 238 determines that the dry electrode mixture M is filled up to a predetermined position through the supply hose 12, the controller 250 may switch the valve 14 to a closed position so that the supply of the dry electrode mixture M is automatically shut off.

Referring again to FIGS. 3 to 8, the operation of the electrical conductivity measurement device 20 according to the present disclosure is as follows.

Figure 3:
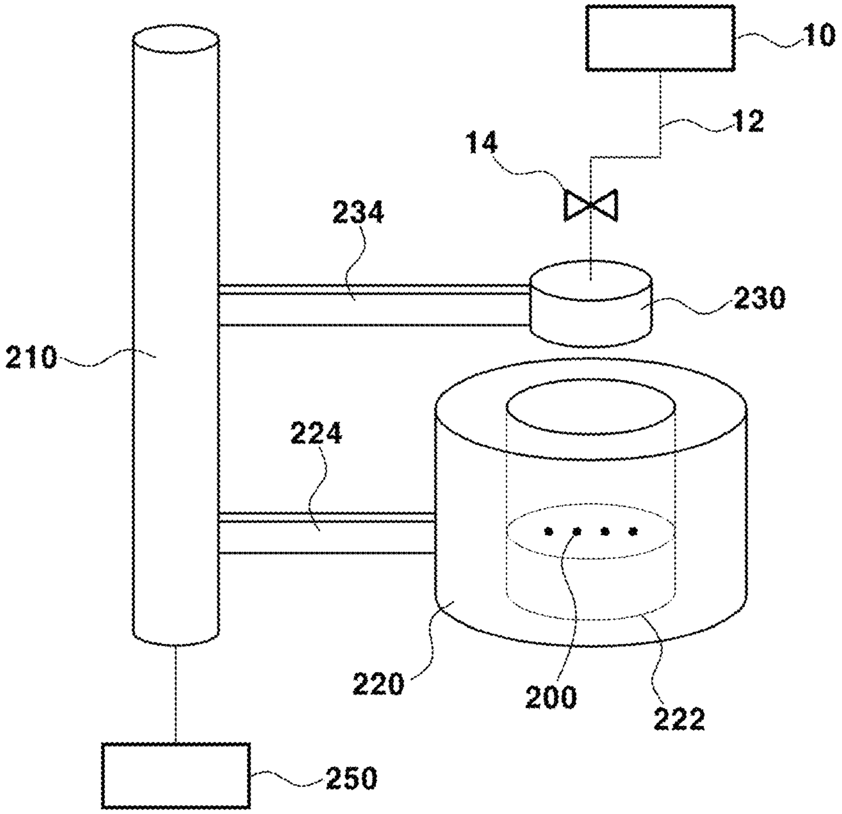
FIGS. 3 to 8 illustrate the operation process of an electrical conductivity measurement device of an evaluation system for a dry electrode mixture according to an embodiment of the present disclosure.

As illustrated in FIGS. 3 and 4, the measurement space 220 is disposed on the support 222 in which the probe 200 is installed. The feeder 230 is supplied with a predetermined amount of dry electrode mixture M through the supply hose 12. The feeder 230 moves downward to supply the dry electrode mixture M onto the support 222 and rotates with respect to the base rod 210 to a non-operating position.

Figure 6:
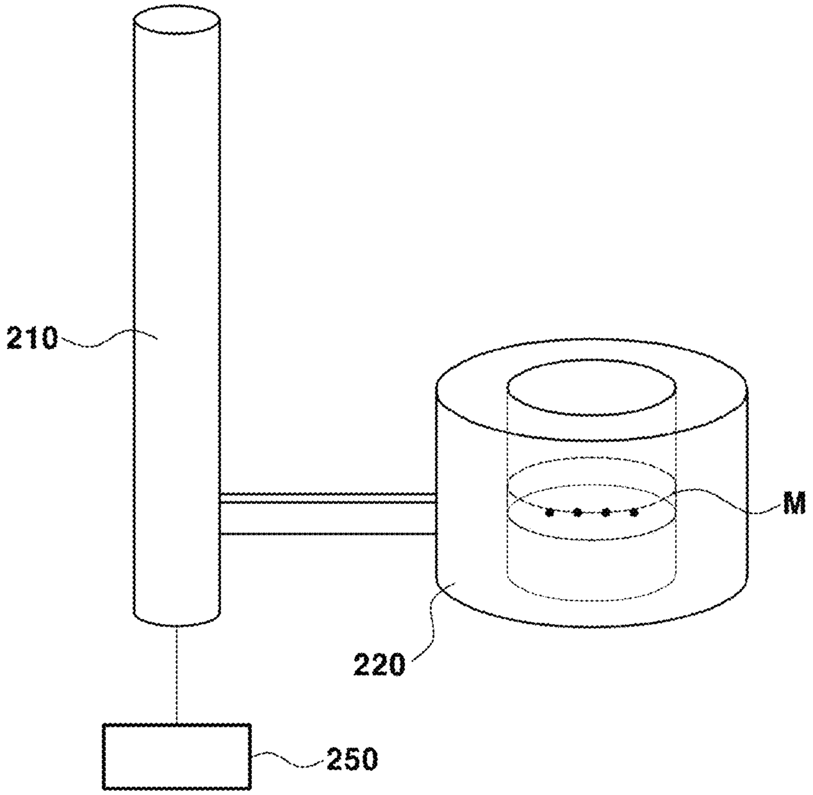

Then, as illustrated in FIGS. 5 and 6, the pressure applicator 240 is introduced into the measurement space 220. The pressure applicator 240 primarily moves downward at a low speed. The pressure applicator 240 is brought into contact with the dry electrode mixture M and moves downward until a pressure of less than about 1 kN is applied to the dry electrode mixture M to flatten the same, and then moves upward. Thereafter, the pressure applicator 240 secondarily moves downward. The probe 200 measures the conductivity of the dry electrode mixture M at the pressure applied when the pressure applicator 240 secondarily moves downward. When the measurement ends, the pressure applicator 240 rotates with respect to the base rod 210 to the non-operating position.

Figure 7:
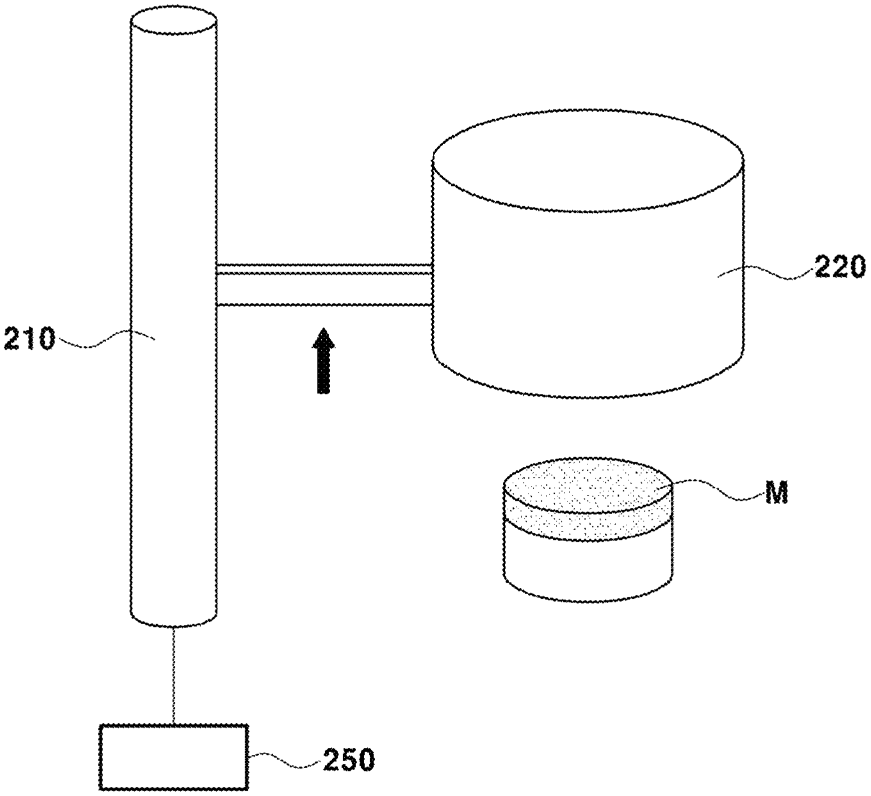
Figure 8:
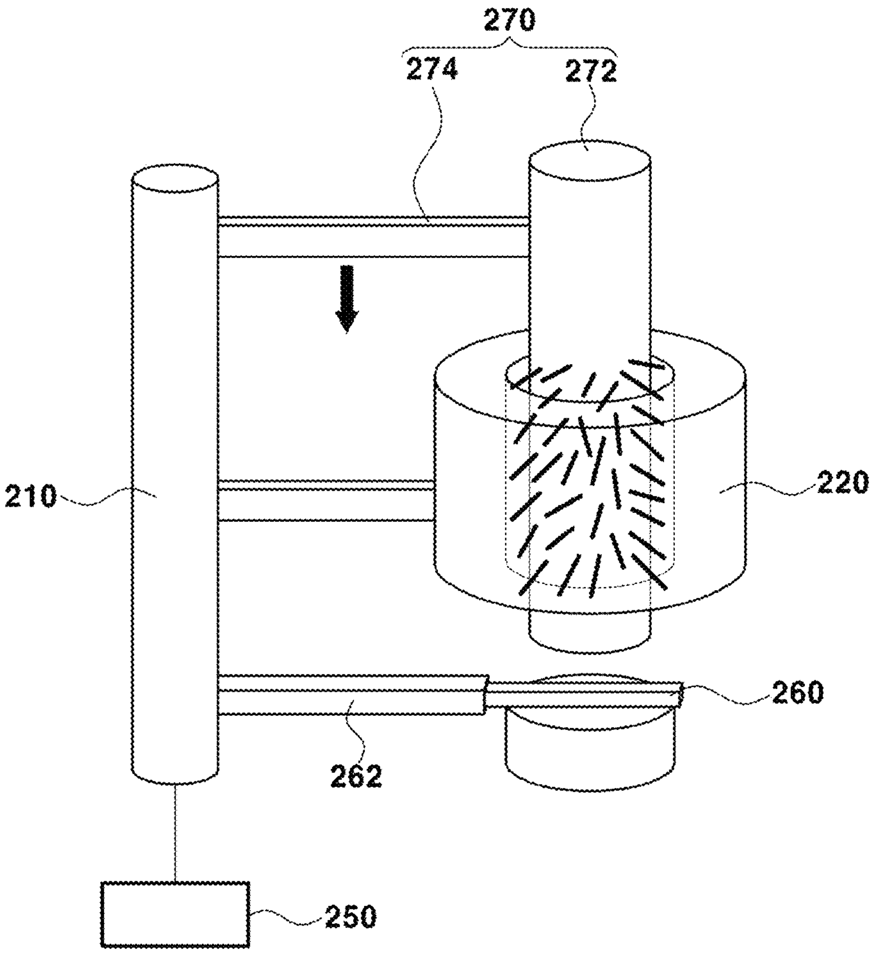

As illustrated in FIG. 7, the measurement space 220 moves upward when the measurement ends. Next, as illustrated in FIG. 8, the remover 260 removes the dry electrode mixture M from the support 222 using a suctioning method and the like. Then the cleaner 270 removes the dry electrode mixture M remaining in the measurement space 220 while rotating inside the measurement space 220. Thereafter, the measurement space 220 moves downward again to enclose the support 222 and is placed in a standby state to perform a next measurement.

The tables below show that the measurements of conductivity are useful for the identification or evaluation of the dry electrode mixture M.

Experimental Example 1

In order to determine whether even minute differences in the proportion of each element constituting the dry electrode mixture M may be distinguished by the electrical conductivity, the electrical conductivity was measured. The electrode active material and the binder are in weight percent and as shown in Table 1.

TABLE 1

| Samples | Electrode active material (% by weight) | Binder (% by weight) |
|---|---|---|
| A | 98 | 2 |
| B | 97 | 3 |
| C | 96.9 | 3.1 |
| D | 96.99 | 3.01 |

Figure 11:
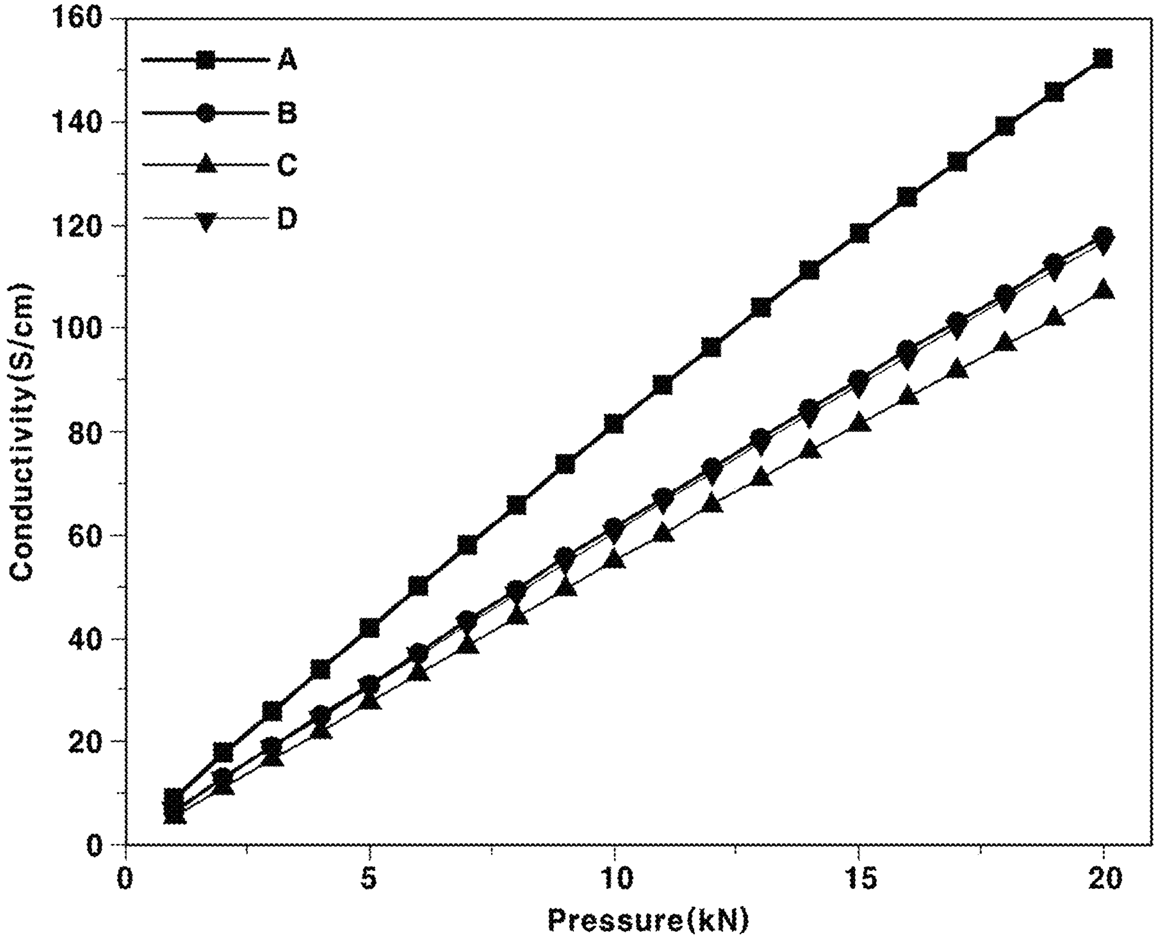
FIGS. 11 and 12 are graphs in which mixtures with different proportions of electrode material and binder are distinguished based on conductivity measurements.
Figure 12:
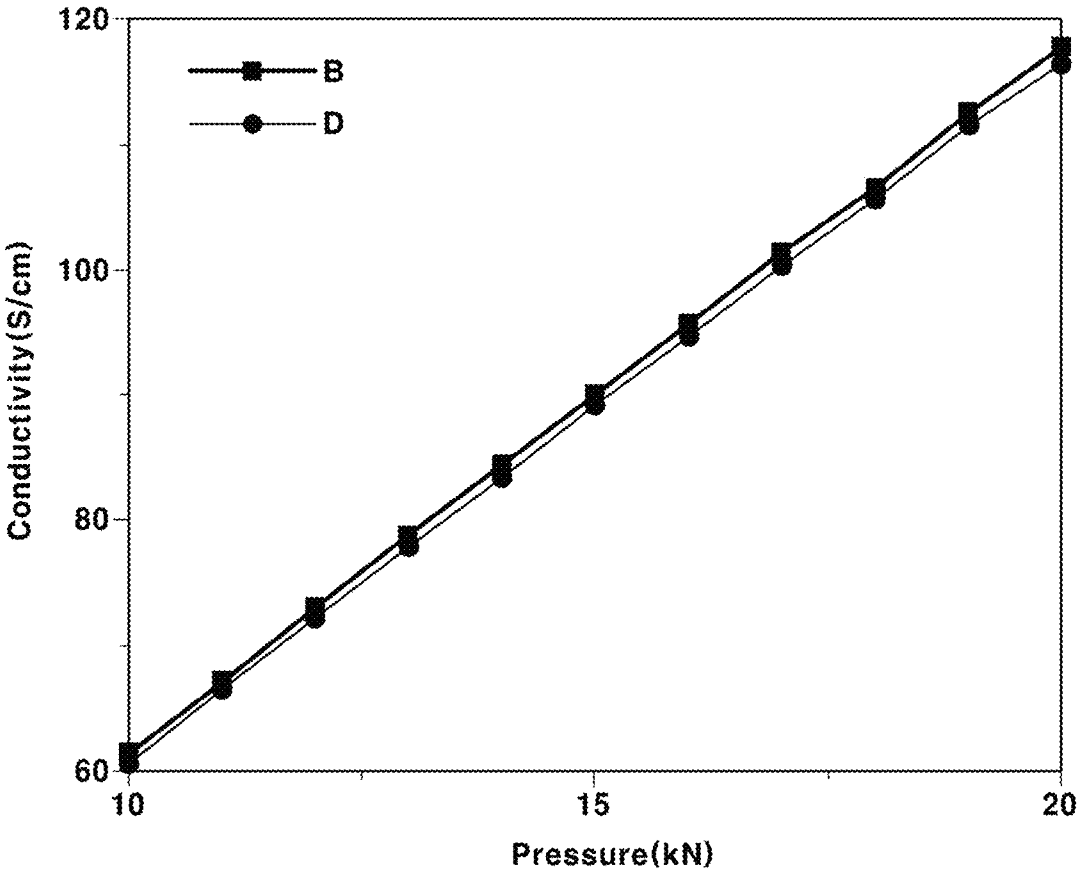

FIGS. 11 and 12 show the result of the measurement. As described above, from the result of measuring the conductivity while applying pressure to the dry electrode mixture M according to the present disclosure, it was confirmed that even a very small difference of about 0.01% of the binder was distinguishable.

Experimental Example 2

In Experimental Example 2, in addition to the electrode active material and the binder in Experimental Example 1, a conductive additive was further included in the mixture to measure the conductivity of the same as shown in Table 2.

TABLE 2

| Samples | Active material (% by weight) | Binder (% by weight) | Conductive additive (% by weight) |
|---|---|---|---|
| A | 96 | 2 | 2 |
| B | 96.5 | 1.5 | 2 |
| C | 97 | 1 | 2 |
| D | 95 | 4 | 1 |
| E | 92 | 6 | 2 |

In samples A and B, the electrode active material and the binder were changed by 0.5% by weight without changing the conductive additive. In samples B and C, the electrode active material and the binder were changed by 0.5% by weight without changing the conductive additive. In samples A and C, the electrode active material and the binder were changed by 1% by weight without changing the conductive additive. Samples D and E were cases where the binder was slightly increased by weight.

Figure 13:
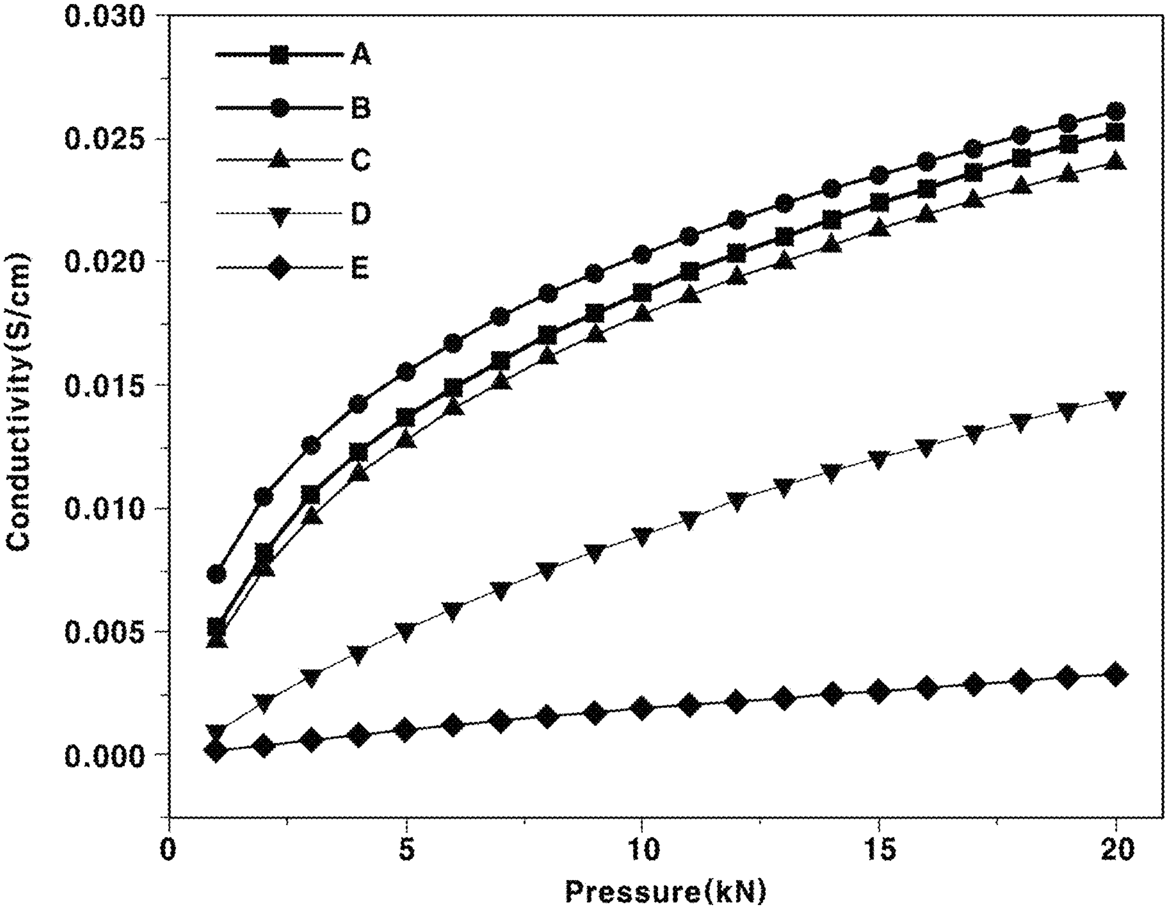
FIG. 13 is a graph in which mixtures with different proportions of electrode material, binder, and conductive additive are distinguished based on conductivity measurements.

As shown in FIG. 13, it was confirmed that even when the three constituents of the dry electrode mixture M were changed, they could be clearly distinguished based on the conductivity measurement.

According to the present disclosure, the analysis device 30 is configured to receive and analyze the measurement results measured by the electrical conductivity measurement device 20. According to the present disclosure, the analysis device 30 may identify any dry electrode mixture M by the measurement of the conductivity thereof.

To this end, the analysis device 30 is configured to learn data on the dry electrode mixture. Particularly, the analysis device 30 is configured to learn previously obtained datasets (e.g., obtained through experimentation) for a plurality of dry electrode mixture samples. Each dataset comprises mixture information on the dry electrode mixture (i.e., the proportion of each constituent, the dispersing speed, and the dispersing time of the dry electrode mixture). Particularly, the dry electrode mixture for each dataset may be a mixture previously determined (e.g., determined through experimentation) to be properly fiberized.

Specifically, samples of properly fiberized various constituents of the dry electrode mixture are prepared in different proportions, dispersing speeds, and dispersing times. Then the measuring device 20 measures the conductivity of each sample depending on the pressure applied thereto. Each dataset includes the proportion of the constituents, the dispersing speed (e.g., the rotational speed of the mixer), the dispersing time (e.g., the mixing time or operating time of the mixer) of the dry electrode mixture, and the conductivity depending on the pressure.

The plurality of datasets prepared in this way is learned by the analysis device 30. For example, the analysis device 30 performs machine learning on the datasets through an artificial intelligence model, and the learned artificial intelligence model is stored in the analysis device 30. The analysis device 30 may evaluate and predict the characteristics of the dry electrode mixture, which is the evaluation target, through the learned artificial intelligence model.

Accordingly, the evaluation system of the present disclosure may identify any dry electrode mixture (hereinafter, "dry electrode mixture to be evaluated"). For example, the evaluation system of the present disclosure may measure the electrical conductivity of the dry electrode mixture to be evaluated depending on the pressure applied thereto through the device 20, and may derive estimated mixture information on the dry electrode mixture through the analysis device 30 or the artificial intelligence model of the analysis device 30 based on the conductivity measurement. As described above, the estimated mixture information may include at least one of: the proportion of the constituents, the dispersing speed, or the dispersing time of the dry electrode mixture to be evaluated.

According to the evaluation system of the present disclosure, a dry electrode mixture, which is the evaluation target, may be evaluated based on estimated mixture information. In other words, an estimated proportion of each constituent, an estimated dispersing speed, and/or an estimated dispersing time of the dry electrode mixture to be evaluated may be obtained through the estimated mixture information.

Further, it may be determined whether the dry electrode mixture having the estimated mixture information satisfies the evaluation criterion. For example, whether the proportion of a constituent of the dry electrode mixture to be evaluated is appropriate may be determined by comparing the estimated proportion of the constituent of the dry electrode mixture to be evaluated with a preset proportion reference. Alternatively, whether the dispersion degree is appropriate may be determined by comparing the obtained estimated mixture information with a preset criterion.

Additionally, the fibrous degree of the binder of the dry electrode mixture to be evaluated may be evaluated based on the estimated mixture information. As described above, an appropriate fibrous degree may indicate that the dispersing speed and the dispersing time are sufficient, the electrical conductivity is greater than a predetermined value, and the dry electrode mixture may be made into a film. The analysis device 30 includes a processor 32 and a memory 34. Instructions executable by the processor 32 are stored in the memory 34. In an implementation of the present disclosure, the instructions may include instructions for executing the operation of the processor 32 and/or the operation of each component of the processor 32.

The memory 34 may be a volatile memory or a non-volatile memory. As a non-limiting example, the volatile memory may be dynamic random access memory (DRAM), static random access memory (SRAM), and the like. As another non-limiting example, the non-volatile memory may be an electrically erasable programmable read-only memory (EEPROM), flash memory, magnetic RAM (MRAM), CD-ROM, DVD-ROM, and the like.

The processor 32 may execute instructions stored in the memory 34. The processor 32 may execute computer readable codes and instructions stored in the memory 34. As a non-limiting example, the processor 32 may include a central processing unit, a graphics processing unit, a neural processing unit, a multi-core processor, a multiprocessor, an application-specific integrated circuit (ASIC), and a field programmable gate array (FPGA).

According to some implementations of the present disclosure, the analysis device 30 may also be implemented in the form of a recording medium containing instructions executable by a computer, such as program modules executed by a computer. Computer readable media may be any available media accessible by a computer and includes both volatile and nonvolatile media, and removable and non-removable media. In addition, computer readable media may include all computer storage media. Computer storage media includes both volatile and nonvolatile media, and removable and non-removable media implemented through computer readable instructions, data structures, program modules, or any method or technology for storage of information such as data.

When mixture information on the measured dry electrode mixture is known, the number of measurements of the electrical conductivity may be reduced. According to some embodiments of the present disclosure, when information on the measured dry electrode mixture, such as the mixture proportion and dispersion condition of the measured dry electrode mixture M is known, the analysis device 30 may predict a conductivity in the entire pressure value range of the measured dry electrode mixture M using a logistic regression formula.

Figure 14:
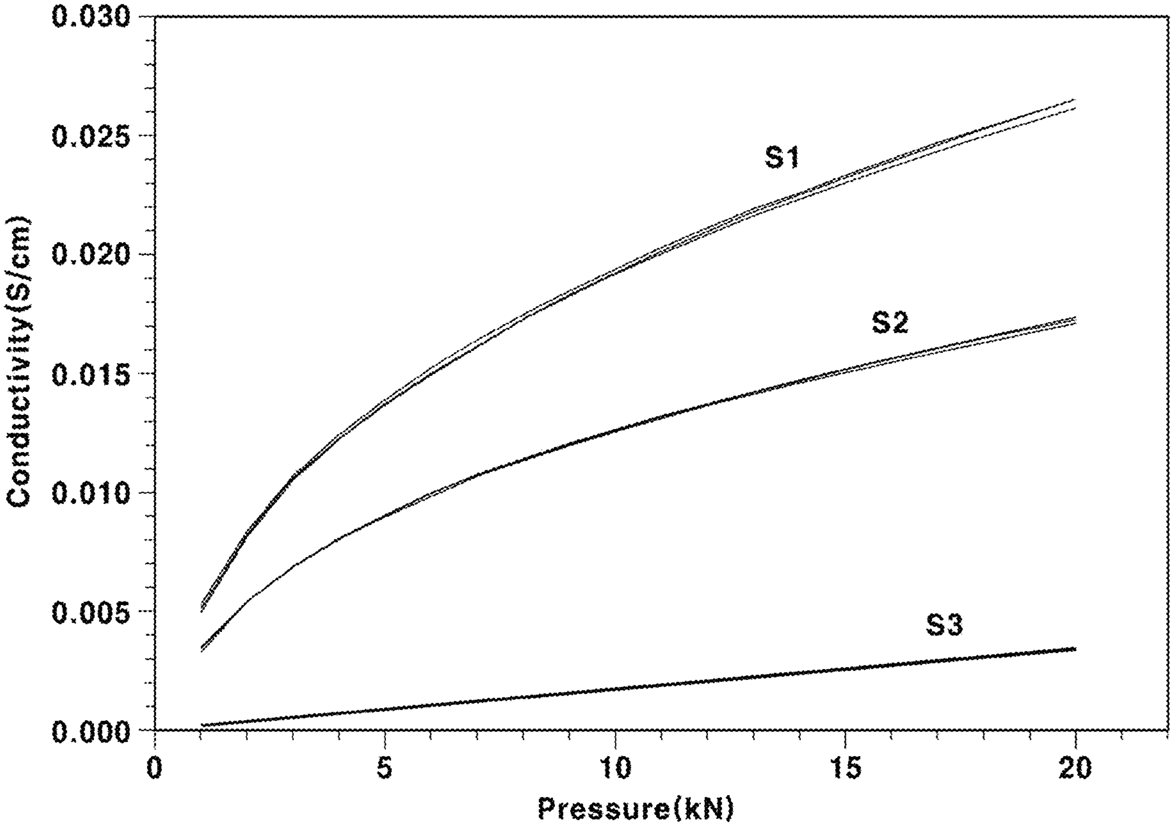
FIGS. 14 and 15 show conductivity measurements depending on pressure applied to example dry electrode mixtures.

For example, when the conductivities of dry electrode mixture samples S1, S2, and S3 are clearly distinguished as shown in FIG. 14, the samples are classified as S1, S2, and S3 and are machine-learned into a logistic regression model of the analysis device 30. When the test samples are input to the logistic regression model, the analysis device 30 may analyze the classified samples. When mixture information, such as the mixing proportion of the constituents and dispersion condition of the dry electrode mixture M to be evaluated is known, the analysis device 30 may identify the corresponding dry electrode mixture M only with the electrical conductivity measured at at least two pressure values. When the mixture information is known, it may be used to determine whether the sample is good or bad or to check whether there are errors when preparing several set samples sequentially.

Figure 15:
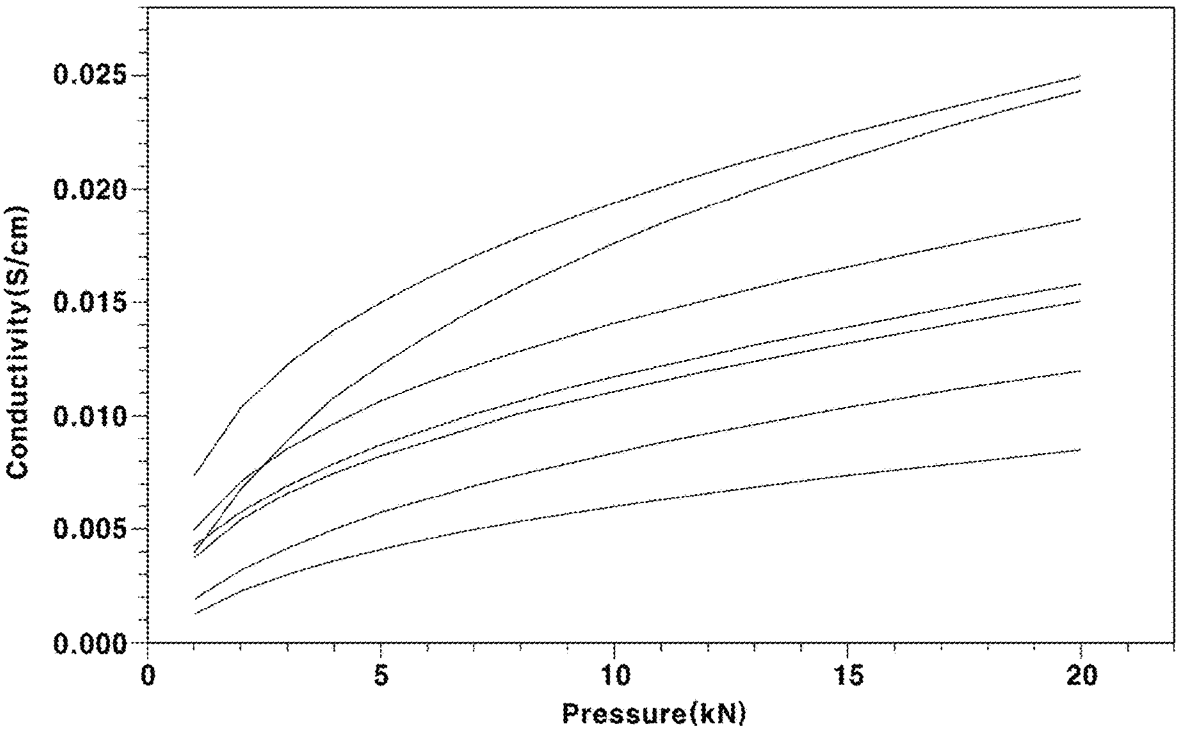

According to some embodiments of the present disclosure, when mixture information such as the mixing proportion and dispersion condition of the measured dry electrode mixture M is unknown, the analysis device 30 may predict the electrical conductivity in the entire pressure value range of the measured dry electrode mixture M using a neural network model. As shown in FIG. 15, the electrical conductivity of the dry electrode mixture may be obtained in a curved line over the entire pressure range by the measuring device 20. Information and electrical conductivity of the dry electrode mixture M under these various conditions are learned by the neural network.

When mixture information on the dry electrode mixture M is not known, the analysis device 30 collects the electrical conductivity measured at at least three pressure values. Here, the three pressure values may be randomly designated, but it is preferable to select a pressure with the lowest value of mean absolute error (MAE) in the learning step. Further, the analysis device 30 may predict the electrical conductivity in the entire pressure range using a neural network model based on the conductivity measured at at least three pressure values. The predicted conductivity may be fed back in the mixing process of the dry electrode.

The analysis device 30 machine-learned in the above manner may predict electrical conductivity data in the entire pressure range of the dry electrode mixture M irrespective of whether the information on the dry electrode mixture M is known. This may greatly reduce the time spent on obtaining data.

The evaluation system according to the present disclosure may evaluate the proportion the constituents of and dispersion degree of the dry electrode mixture, and the fibrous degree of the binder by measuring the electrical conductivity. Because the binder acts as an insulator, a high binder proportion results in low conductivity. Further, in a case where the dry electrode mixture is not properly dispersed, the conductivity is measured to be low. When the proportion of the binder is low, the conductivity is measured to be high. In addition, even when the electrode active material, the conductive additive, and the binder are equal in proportion, the fibrous degree of the binder varies depending on the dispersion condition (dispersing speed, dispersing time, etc.), and in this case, the conductivities thereof are measured different.

Figure 16:
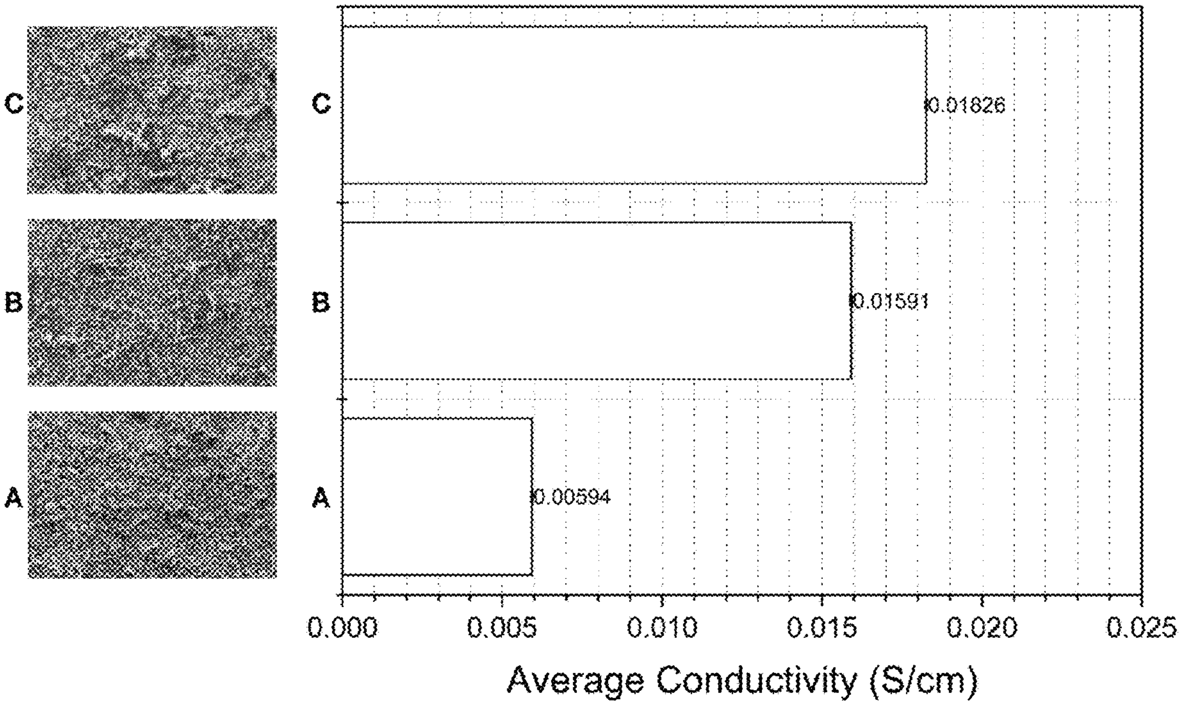
FIG. 16 shows images taken by a scanning electron microscopy and conductivity measurement results of the dry electrode mixture.

FIG. 16 shows images taken by a scanning electron microscopy and conductivity measurement results when the constituents of the dry electrode mixture are equal in proportion but the dispersion conditions are made different in A, B, and C. When the constituents are equal in proportion and the dry electrode mixture is uniformly dispersed, the conductivities thereof are measured to be equal. However, the shape thereof varies depending on the fibrous degree of the binder, and the different shape acts as a characteristic that hinders the movement of electrons. In the case of A, B, and C, the conductivities are all measured to be different, so it may be determined whether the fiberization of the binder is satisfactory using the electrical conductivity, which shows slight differences between A, B, and C.

As such, the evaluation system according to the present disclosure facilitates control of the quality of the dry electrode mixture by monitoring the dry electrode mixture in real time.

As is apparent from the above description, the present disclosure provides the following effect.

According to the present disclosure, there is provided an evaluation system for a dry electrode mixture capable of measuring and analyzing the characteristics of the dry electrode mixture during manufacture of the dry electrode.

Effects of the present disclosure are not limited to what has been described above, and other effects not mentioned herein will be clearly recognized by those skilled in the art based on the above description.

It will be apparent to those of ordinary skill in the art to which the present disclosure pertains that the present disclosure described above is not limited by the above-described embodiments and the accompanying drawings, and various substitutions, modifications and changes are possible within a range that does not depart from the technical idea of the present disclosure.

What is claimed is:

1. A system for evaluating a dry electrode mixture in powder form, the system comprising:

an electrical conductivity measurement device configured to measure an electrical conductivity of the dry electrode mixture; and an analysis device configured to evaluate the dry electrode mixture based on the measured electrical conductivity, wherein the analysis device is configured to:

machine-learn information on a plurality of dry electrode mixture samples through an artificial intelligence model, and output estimated information on the dry electrode mixture to be evaluated through the machine-learned artificial intelligence model, wherein the information on the plurality of dry electrode mixture samples includes mixture information on each of the dry electrode mixture samples and an electrical conductivity of each of the dry electrode mixture samples depending on a pressure applied to the dry electrode mixture samples, wherein the mixture information includes a proportion of each constituent, a dispersing speed, and a dispersing time of the dry electrode mixture samples.

2. The system according to claim 1, wherein the dry electrode mixture is prepared by mixing an electrode active material, a conductive additive, and a binder without a solvent.

3. The system according to claim 2, wherein the analysis device is configured to analyze mixture information of the dry electrode mixture based on the measured electrical conductivity.

4. The system according to claim 3, wherein the mixture information includes one or more of: a proportion of each constituent, a dispersing speed, or a dispersing time of the dry electrode mixture.

5. The system according to claim 3, wherein the analysis device is configured to evaluate a fibrous degree of the binder based on the mixture information.

6. The system according to claim 1, wherein the electrical conductivity is measured while applying a pressure to the dry electrode mixture and changing the pressure.

7. The system according to claim 1, wherein the electrical conductivity measurement device comprises:

a probe configured to measure the electrical conductivity;

a support, wherein the probe is installed at the support and the dry electrode mixture to be measured is placed; and a pressure applicator configured to apply pressing force to the dry electrode mixture.

8. The system according to claim 7, wherein the electrical conductivity measurement device further comprises:

a measurement space disposed to enclose the support; and a feeder configured to supply the dry electrode mixture to the support.

9. The system according to claim 7, wherein the electrical conductivity measurement device further comprises a remover configured to remove the dry electrode mixture from the support.

10. The system according to claim 8, wherein the electrical conductivity measurement device further comprises a cleaner configured to remove the dry electrode mixture remaining in the measurement space.

11. The system according to claim 1, wherein the electrical conductivity measurement device comprises:

a base rod fixed by being spaced apart from a support, wherein the dry electrode mixture to be measured is disposed at the based rod and a probe configured to measure the electrical conductivity;

a plurality of arms rotatably and linearly movably mounted to the base rod;

a feeder mounted to a first arm among the plurality of arms, wherein the feeder is configured to supply the dry electrode mixture to the support; and a pressure applicator mounted to a second arm among the plurality of arms, wherein the pressure applicator is configured to apply a pressing force to the dry electrode mixture placed on the support.

12. The system according to claim 11, wherein the electrical conductivity measurement device further comprises a remover mounted to a third arm among the plurality of arms, wherein the remover is configured to remove the dry electrode mixture from the support.

13. The system according to claim 12, wherein the electrical conductivity measurement device further comprises:

a measurement space mounted to a fourth arm among the plurality of arms and disposed to enclose the support; and a cleaner mounted to a fifth arm among the plurality of arms and configured to remove the dry electrode mixture remaining in the measurement space.

14. The system according to claim 13, wherein the electrical conductivity measurement device further comprises:

first rails recessed in opposite sides of the base rod, respectively;

rotating bodies mounted to the base rod and rotatably mounting the plurality of arms to the base rod, respectively; and second rails recessed in the rotating body and alignable with the first rails, respectively.

15. The system according to claim 1, wherein the analysis device is configured to:

receive the electrical conductivity of the dry electrode mixture to be evaluated with respect to pressure, wherein the electrode conductivity is measured by the measurement device, and output estimated mixture information on the dry electrode mixture to be evaluated, and wherein the estimated mixture information includes one or more of: an estimated proportion of constituents of, an estimated dispersing speed of, or an estimated dispersing time of the dry electrode mixture to be evaluated.

16. The system according to claim 15, wherein:

the analysis device is configured to compare the estimated mixture information with a preset reference value, or the analysis device is configured to determine a fibrous degree of a binder, the binder being one of constituents of the dry electrode mixture to be evaluated, based on the estimated mixture information.

17. A battery for a vehicle, the battery being produced by the system of claim 1.

18. A vehicle comprising the battery of claim 17.

* * * * *